(12) United States Patent
Wu et al.

(10) Patent No.: US 11,329,640 B1
(45) Date of Patent: May 10, 2022

(54) ANALOG DELAY LINES AND ANALOG READOUT SYSTEMS

(71) Applicant: Keysight Technologies, Inc., Santa Rosa, CA (US)

(72) Inventors: Charles Wu, San Jose, CA (US); Ken A. Nishimura, Fremont, CA (US); Kenneth D. Poulton, Palo Alto, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 17/178,633

(22) Filed: Feb. 18, 2021

(51) Int. Cl.
| | |
|---|---|
| *H03K 5/14* | (2014.01) |
| *G11C 27/00* | (2006.01) |
| *G11C 7/22* | (2006.01) |
| *G11C 7/10* | (2006.01) |
| *H03K 5/00* | (2006.01) |

(52) U.S. Cl.
CPC ............. *H03K 5/14* (2013.01); *G11C 7/1069* (2013.01); *G11C 7/1096* (2013.01); *G11C 7/222* (2013.01); *G11C 27/00* (2013.01); *H03K 2005/00026* (2013.01)

(58) Field of Classification Search
CPC ........... H03K 5/14; H03K 2005/00026; G11C 7/1069; G11C 7/1096; G11C 7/222; G11C 27/00
USPC .......................................................... 365/45
See application file for complete search history.

(56) References Cited

U.S. PATENT DOCUMENTS

| | | | | |
|---|---|---|---|---|
| 6,061,279 | A | * 5/2000 | Toda | .................... G11C 27/024 365/149 |
| 6,222,409 | B1 | 4/2001 | Kieda et al. | |
| 8,289,062 | B2 | * 10/2012 | Lin | ........................ H03K 5/133 327/278 |

(Continued)

*Primary Examiner* — Son L Mai

(57) ABSTRACT

An analog delay line includes a clock generator, an analog sampling circuit, a bank of analog memory cells, a memory controller, an analog readout circuit, and an analog multiplexer. The clock generator is configured to output plural reception clock signals of different frequencies and plural transmission clock signals of different frequencies, the transmission clock signals offset in accumulated phase relative to the reception clock signals. The analog sampling circuit is controlled by at least one of the reception clock signals, and is configured to output a sequence of sampled voltages of an analog input signal. The memory controller is configured to control a write operation at a write frequency of at least one of the reception clock signals and a read operation at a read frequency of at least one of the transmission clock signals. The write operation is for sequentially storing the sampled voltages received from the analog sampling circuit in the bank of analog memory cells, and the read operation is for sequentially reading the sampled voltages from the bank of analog memory cells. The analog readout circuit is configured to buffer the sampled voltages read from the bank of analog memory cells. The analog multiplexer is controlled by at least one of the transmission clock signals, and is configured to multiplex the sampled voltages buffered by the readout circuit to generate an analog output signal. A sampling rate of the analog input signal is within a factor of 2 of a sampling rate of the analog output signal.

20 Claims, 7 Drawing Sheets

(56) References Cited

U.S. PATENT DOCUMENTS

| | | | |
|---|---|---|---|
| 8,773,187 B2 * | 7/2014 | Lin | H03H 11/26 |
| | | | 327/278 |
| 8,780,643 B2 | 7/2014 | Ishikawa | |
| 8,780,653 B2 | 7/2014 | Ito et al. | |
| 10,389,340 B2 * | 8/2019 | Nakagawa | G11C 27/00 |

* cited by examiner

… (1)

ANALOG DELAY LINES AND ANALOG READOUT SYSTEMS

BACKGROUND

The inventive concepts generally relate to analog delay lines and to analog readout systems such as Arbitrary Waveform Generators (AWGs).

More and more emerging markets and applications, such as Fifth-Generation (5G) wireless, mmWave radar, and Quantum computing, require the provisioning of low latency signal paths with variable delay. Conventional solutions include passive analog electrical delay lines and active analog electrical delay lines. Passive analog delay lines suffer the drawbacks of being bulky with high signal loss, and only cover a limited range. Active analog electrical delay lines have the disadvantages of being nonlinear and tuned for narrow frequency bands, and are therefore incapable of supporting wide-band applications. Other conventional solutions include analog optical delay lines, but these are bulky, expensive and nonlinear. Still other conventional solutions include mixed signal delay line architectures which, for example, convert an input analog signal into a digital signal (ADC), digitally delay the digital signal (digital delay), and then convert the delayed digital signal to an analog output signal (DAC). The complexity of mixed signal delay lines results in high power consumption and excessive latency.

SUMMARY

According to an aspect of the inventive concepts, an analog delay line is provided which includes a clock generator, an analog sampling circuit, a bank of analog memory cells, a memory controller, an analog readout circuit, and an analog multiplexer. The clock generator is configured to output plural reception clock signals of different frequencies and plural transmission clock signals of different frequencies, the transmission clock signals offset in accumulated phase relative to the reception clock signals. The analog sampling circuit is controlled by at least one of the reception clock signals, and is configured to output a sequence of sampled voltages of an analog input signal. The memory controller is configured to control a write operation at a write frequency of at least one of the reception clock signals and a read operation at a read frequency of at least one of the transmission clock signals. The write operation is for sequentially storing the sampled voltages received from the analog sampling circuit in the bank of analog memory cells, and the read operation is for sequentially reading the sampled voltages from the bank of analog memory cells. The analog readout circuit is configured to buffer the sampled voltages read from the bank of analog memory cells. The analog multiplexer is controlled by at least one of the transmission clock signals, and is configured to multiplex the sampled voltages buffered by the readout circuit to generate an analog output signal. A sampling rate of the analog input signal is within a factor of 2 of a sampling rate of the analog output signal.

The analog output signal may be delayed relative to the analog input signal by an amount corresponding to the offset in accumulated phase between the transmission and reception clock signals. Also, the offset in accumulated phase between the transmission and reception clock signals may be programmable.

The bank of analog memory cells may include N inputs respectively receiving the sampled voltages from N outputs of the analog sampling circuit, and the bank of analog memory cells may N outputs respectfully outputting sampled voltages which are supplied to N inputs of the analog multiplexers via the analog readout circuit, where N is an integer. N may be 32 or more. Also, the N inputs of the bank of analog memory cells may be connected to an N×M array of memory elements, where M is an integer of 2 or more defines a number of sets of N memory elements. A set of N memory elements of the N×M array of memory elements may be written during each write cycle of the write operation, and a set of N memory elements of the N×M array of memory elements may be read during each read cycle of the read operation. Also, wherein, for each of the M sets of N memory elements, the write cycle of the write operation may be delayed relative to the read cycle of the read operation by an amount corresponding to the offset in accumulated phase between the transmission and reception clocks.

The analog multiplexer may be a multi-rank multiplexer, and the analog sampling circuit may include a multi-rank demultiplexer.

The analog readout circuit may include a plurality of buffer elements, and each buffer element may be configured to sequentially buffer the sampled voltages read from a plurality of memory cells of the bank of analog memory cells. Also, the readout circuit may further include a plurality of voltage-to-current elements configured to convert a voltage output by each of the buffer elements into a corresponding current that is applied to the analog multiplexer. Here, the analog multiplexer may generate the analog output signal by applying a multiplexed current to an output network. Separately, the read and write frequencies may be less than a frequency at which a lowest rank of the multi-rank multiplexer is controlled.

According to another aspect of the inventive concepts, a readout system is provided which includes a clock generator, a bank of analog memory cells, a memory controller, an analog readout circuit, and an analog multiplexer. The clock generator is configured to output plural transmission clock signals of different frequencies. The bank of analog memory cells includes N outputs, where N is a plural integer. The memory controller is configured to control a read operation at a read frequency of at least one of the transmission clock signals, the read operation sequentially reading analog voltages from the N outputs of the bank of analog memory cells. The analog readout circuit includes N analog buffers configured to buffer the analog voltages read from the N outputs of the bank of analog memory cells, respectively, and N voltage-to-current elements configured to convert a voltage output by a respective analog buffer into a corresponding analog current. The analog multiplexer has N inputs, is controlled by at least one of the transmission clock signals, and configured to multiplex the analog currents from the readout circuit to generate an analog output signal.

The analog multiplexer may be multi-rank multiplexer, and N may be 32 or more. The N inputs of the bank of analog memory cells may be connected to an N×M array of memory elements, where M is an integer of 2 or more defining a number of sets of N memory elements. The set of N memory elements of the N×M array of memory elements may be read during each read cycle of the read operation.

The analog multiplexer may generate the analog output signal by applying a multiplexed current to an output network.

The readout system may be an arbitrary waveform generator (AWG).

According to another aspect of the inventive concepts, a method of delaying an analog input signal. The method includes generating plural reception clock signals of different frequencies and plural transmission clock signals of different frequencies, the transmission clock signals offset in accumulated phase relative to the reception clock signals. The method further includes sampling an analog input signal at a sampling frequency of at least one of the reception clock signals to generate a sequence of sampled voltages of an analog input signal, and writing the sampled voltages to a bank of analog memory cells at a write frequency of at least one of the reception clock signals. The method still further includes reading the sampled voltages from the bank of analog memory cells at a read frequency of at least one of the transmission clock signals, buffering the sampled voltages read from the bank of analog memory cells, and multiplexing the buffered sampled voltages under control of at least one of the transmission clock signals to generate an analog output signal. The sampling rate of the analog input signal is within a factor of 2 of a sampling rate of the analog output signal.

BRIEF DESCRIPTION OF THE DRAWINGS

The above and other aspects and features of the inventive concepts will become readily apparent from the detailed description that follows, with reference to the accompanying drawings, in which.

DETAILED DESCRIPTION

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

Figure 1:
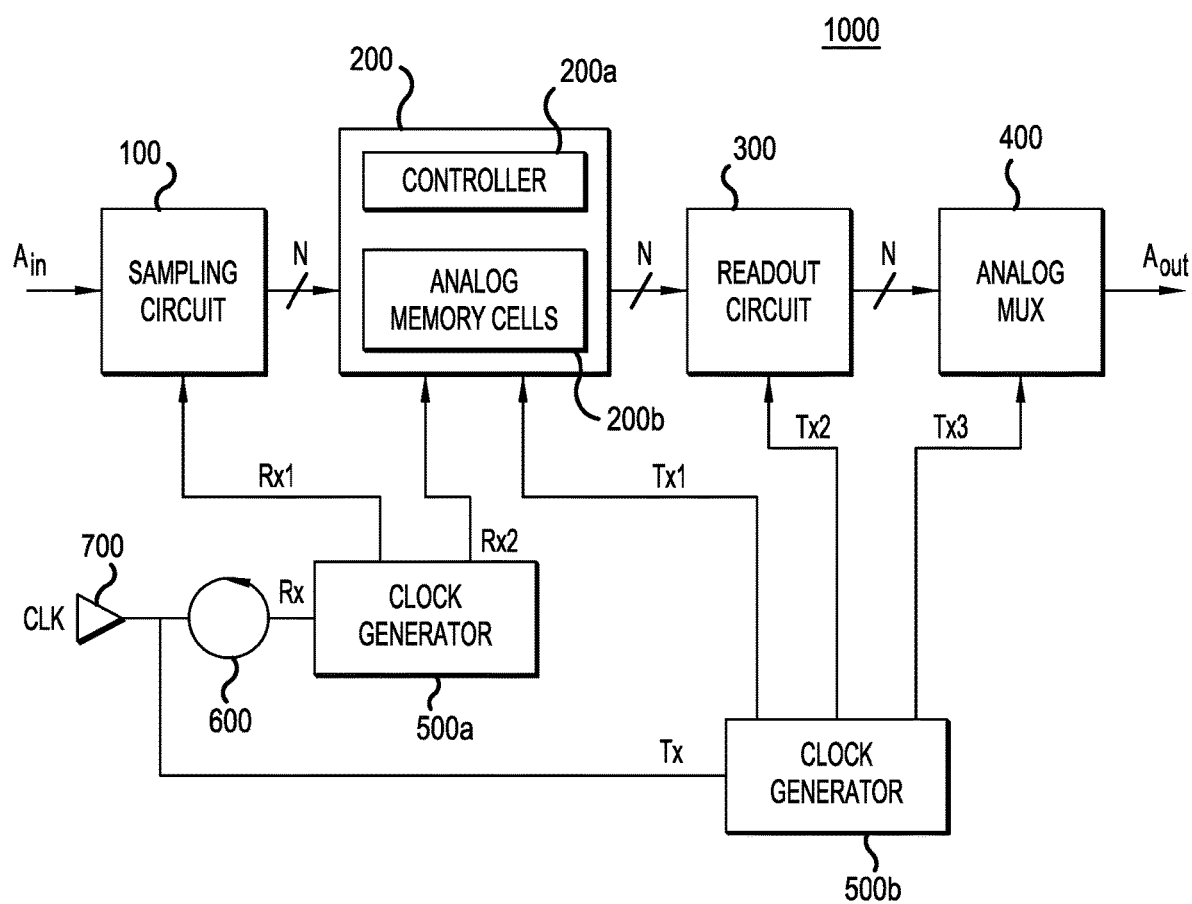
FIG. 1 is a circuit diagram of an analog delay line system according to an embodiment of the inventive concepts.

FIG. 1 is a circuit diagram of an analog delay line 1000 according to an embodiment of the inventive concepts. As will be explained, the analog delay line 1000 of the example of FIG. 1 carries out signal delay operations entirely in the analog domain, thereby reducing latency relative to mixed signal delay lines which require analog/digital conversion and digital processing. In the figures, $A_{in}$ denotes an analog input signal and $A_{out}$ denotes a delayed analog output signal.

Referring to the example of FIG. 1, the analog delay line 1000 includes a sampling circuit 100, an analog memory 200, an analog readout circuit 300, an analog multiplexer (Mux) 400, a first (Rx) clock generator 500*a*, a second (Tx) clock generator 500*b*, a phase rotator 600, and a buffer circuit 700.

The clock generators 500*a* and 500*b* are circuits configured to output plural reception (Rx) clock signals of different frequencies and plural transmission (Tx) clock signals of different frequencies, where the transmission (Tx) clock signals are offset in accumulated phase relative to the reception (Rx) clock signals. In the example embodiment illustrated in FIG. 1, the reception (Rx) clock signals are denoted as a first reception clock Rx1 and a second reception clock Rx2, while the transmission (Tx) clock signals are denoted as a first transmission clock Tx1, a second transmission clock Tx2 and a third transmission clock Tx3. As will be explained in more detail later, the first reception clock Rx1 controls a sampling operation of the sampling circuit 100, and the second reception clock Rx2 controls a write operation to the analog memory 200. As also will be explained in more detail later, the first transmission clock Tx1 controls a read operation from the analog memory 200, the second transmission clock Tx2 controls an operation of the readout circuit 300, and the third transmission clock Tx3 controls an operation of the analog MUX 400.

As mentioned above, transmission (Tx) clock signals are offset in accumulated phase relative to the reception (Rx) clock signals. In the example embodiment of FIG. 1, this is achieved by applying a system reference clock CLK to the input of the buffer circuit 700, and a signal output from the buffer circuit 700 is applied as a reference transmission clock Tx to the Tx clock generator 500b. Separately, the reference transmission clock CLK buffered by the buffer circuit 700 is phase-adjusted to obtain a reference reception clock Rx that is applied to the Rx clock generator 500a. The phase adjustment may, for example, be carried out using the phase rotator 600 depicted in FIG. 1. It is noted, however, that the inventive concepts are not limited to the provision of a phase rotator to achieve the offset in accumulated phase between the transmission and reception clock signals.

The sampling circuit 100 is configured to sample the analog input signal Ain under control of the first reception clock Rx1, and to output a sequence of N sample analog values on N output lines of the sampling circuit 100. Here, N is an integer of at least 2. This process is continuously repeated such that sequences of N sample analog values are repetitively output as the analog input signal Ain is sampled by the sampling circuit 100. The N sample values of each sequence may be output as sample currents or sample voltages. In one embodiment, the N sample values of each sequence are output as N sample currents (designated as Isamp[0] through Isamp[N−1] in FIG. 3 described later).

The N sample values of each sequence are applied to the analog memory 200 which includes a memory controller 200a (or finite state machine) and analog memory cells 200b. The memory controller 200a controls a write operation to the analog memory cells at a write frequency of the second reception clock signal Rx2, and a read operation from the analog memory cells at a read frequency of the first transmission clock signal Tx1. Here, the write operation is for sequentially storing the sampled values received from the analog sampling circuit 100 into the analog memory cells 200b of the analog memory 200. The read operation is for sequentially reading the sampled voltages from the analog memory cells 200b of the analog memory 200. The delay between when a sample value is written to when it is read is controlled by the offset in accumulated phase between the second reception clock Rx2 and the first transmission clock Tx1.

To bridge between the two separate clock domains (Rx and Tx) without creating any timing violation, the order in which the memory cells 200b are written or read may be controlled by the memory controller operate in a FIFO (first-in first-out) manner. In other words, the analog memory 200 may be written as a circular buffer, i.e., when the write pointer reaches the last memory location, it wraps around to the beginning and continues writing. The read pointer does the same thing. In this way, variable delay may be achieved by controlling the spacing between the write pointer and the read pointer.

In some embodiments of the inventive concepts, the offset in accumulated phase between the transmission and reception clock signals Tx and Rx is programmable. Since the signal delay is controlled by that offset in accumulated phase, the signal delay can be adjusted based on external commands. For example, the external commands may control operating parameters of the phase rotator 600.

After the signal is stored into the analog memory 200, the memory controller 200a selects the memory cells in the appropriate order, and their signals (sample values of the input analog signal $A_{in}$) are sent to the input of the high-speed analog mux 400 through the readout circuit 300 described next.

The readout circuit 300 is configured to buffer each sequence of N sampled values output from the analog memory 200. For example, the readout circuit 300 may include N buffer elements respectively coupled to N output lines of the analog memory 200. Although FIG. 1 illustrates the second transmission clock Tx2 being applied to the readout circuit 300, in some example embodiments of the inventive concepts, the buffer elements of the readout circuit 300 are circuits such as amplifiers which are not directly driven by any clock signal. The readout circuit 300 may also include N voltage-to-current elements coupled to the outputs of the N buffer elements. Again, these voltage-to-current elements may function without being driven by any clock signals.

Still referring to FIG. 1, the analog Mux 400 is controlled by the third transmission clock signal Tx3 to multiplex each sequence of the N sampled voltages buffered by the readout circuit 300 to generate an analog output signal $A_{out}$. The rate at which the analog mux 400 reconstructs the samples output by readout circuit 300 is referred to herein as a sampling rate of the analog output signal $A_{out}$. In embodiments of the inventive concepts, the previously described offset in accumulated phase is established such that the sampling rate of the analog input signal is within a factor of 2 of the sampling rate of the analog output signal.

The analog delay line 1000 may include other components not shown in FIG. 1. For example, although not shown in FIG. 1, the analog delay line 1000 may further include a write circuit that is analogous to the readout circuit 300 and located between the sampling circuit 100 and the analog memory 200. The write circuit may be configured, for example, to convert current signals output by the sampling circuit 100 into voltage signals suitable for storage in the analog memory 200.

Figure 2:
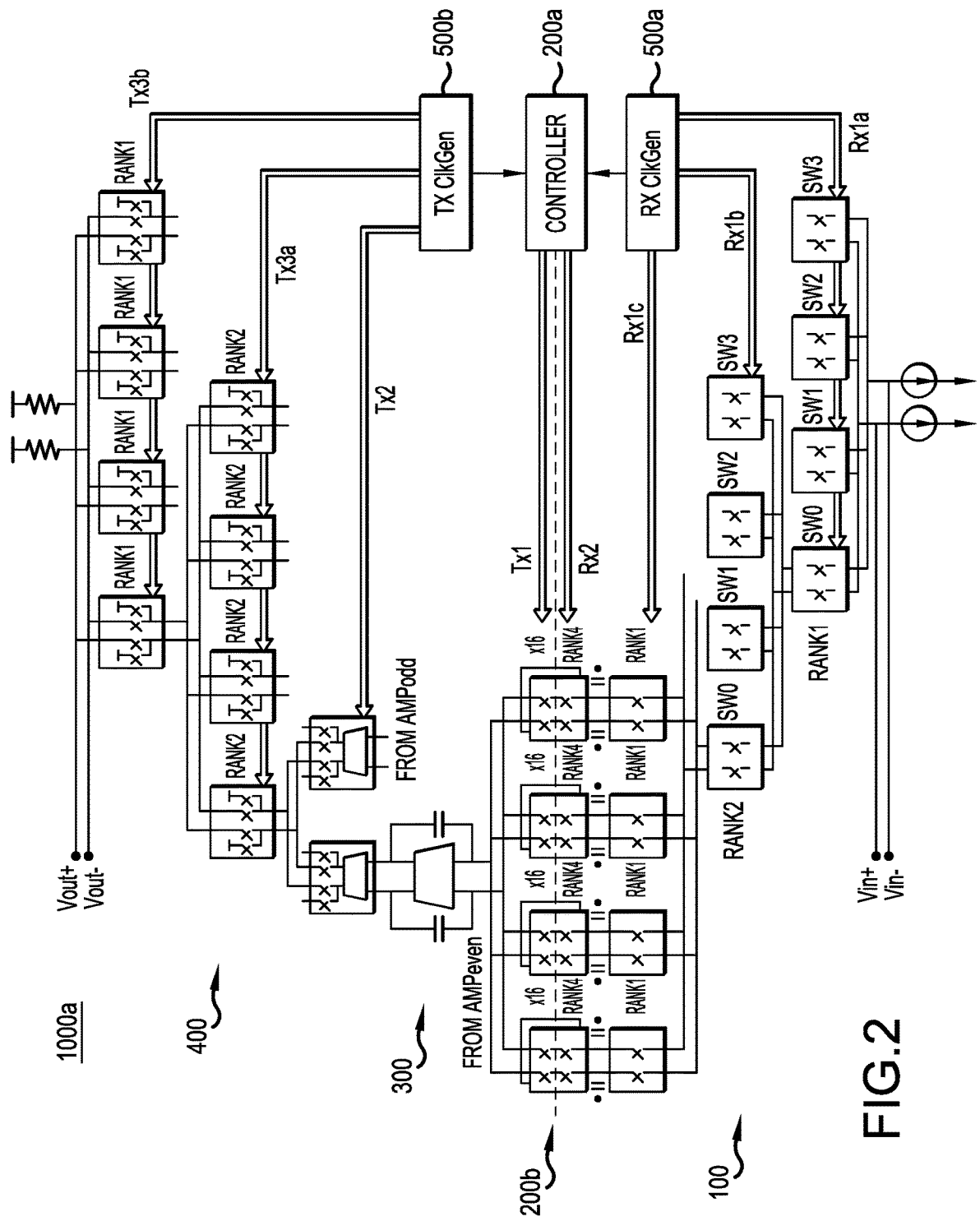
FIG. 2 is a circuit diagram of an analog delay line system according to another embodiment of the inventive concepts.

FIG. 2 is a circuit diagram of an analog delay line 1000a according to an embodiment of the inventive concepts. Elements of the analog delay line 1000a that are the same as or similar to those of the previous embodiment of FIG. 1 are designated with the same reference numbers as in the previous embodiment, and a detailed description of such elements is omitted here to avoid redundancy.

As will be explained below, the system 1000a of FIG. 2 is configured with a high-speed analog demux (de-multiplexer or deserializer) and a group of analog memory banks, where the analog input signal first goes through the high-speed analog demux and it is stored at a series of the analog memory banks which is operated at a substantially lower speed.

More specifically, the sampling circuit 100 of previously described FIG. 1 is implemented by a multi-rank demultiplexer in the embodiment of FIG. 2, the readout circuit 300 of previously described FIG. 1 is implemented by voltage buffers and voltage-to-current conversion elements in the embodiment of FIG. 2, and the analog MUX 400 of previously described FIG. 1 is implemented by a multi-rank multiplexer in the embodiment of FIG. 2.

In the specific example of FIG. 2, the reception clock generator Rx 500a outputs a reception clock signal Rx1a of a frequency $V_1$, a reception clock signal Rx1b of a frequency $V_1/4$, and reception clock signals Rx1c and Rx2 each of a frequency $V_1/32$. Although the inventive concepts are not so limited, the frequency $V_1$ may be the GHz range. The transmission clock generator Tx 500b outputs a transmission clock signal Tx3b of a frequency $V_2$, a transmission clock signal Tx3a of a frequency $V_2/4$, a transmission clock signal Tx2 of a frequency $V_2/4$, and a transmission clock signal Tx1 of $V_2/32$. As explained in connection with FIG. 1, the transmission clock signals are offset in accumulated phase relative to the reception clock signals. As such, the frequency $V_2$ may slightly differ from the frequency $V_1$.

Referring to FIG. 2, Vin+ and Vin− denote input voltage lines of the analog input signal $A_{in}$. These lines are connected as inputs to a first rank Rank1 of switches SW0~SW3. The switches SW0~SW1 sequentially sample the analog input signal $A_{in}$ at a frequency of a reception clock signal Rx1a. That is, the switches SW0~SW1 sequentially switch through a current present on the input voltage lines Vin+ and Vin− from an input to an output at a frequency of the Rx1a reception clock signal.

In the example of FIG. 2, the output of each switch SW0~SW1 of the first rank Rank1 is connected to the inputs of a second rank Rank2 of switches SW0~SW3. Although only one set of switches is shown for the second rank Rank2 of FIG. 2, it will be understood that four (4) sets of switches SW0~SW3 are included in the second rank Rank2 Thus, the second rank Rank2 of this example includes sixteen (16) switches. The switches SW0~SW1 sequentially switch through a current present on the first rank Rank 1 from an input to an output at a frequency of the Rx1b reception clock signal.

Still referring to FIG. 2, the output of each of the switches SW0~SW1 of the second rank Rank2 is connected to inputs of a third rank Rank3 of eight (8) switches defining analog memory input channels. Even numbered switches of one set of the third rank Rank 4 are shown in FIG. 2 as Ch0, Ch2, Ch4 and Ch6. Each set also includes four odd-numbered channels not shown, and it will be understood that sixteen (16) sets (i.e., four sets for each of the four sets of the second rank Rank2) of switches are included in the third rank Rank3. Thus, the third rank Rank3 of this example includes one-hundred twenty-eight (128) switches. These switches of the third rank Rank3 sequentially switch through a current present on the second rank Rank2 from an input to an output at a frequency of the Rx1c reception clock signal.

The 128 channels of the output from the third rank Rank3 are sequentially applied to 128 input channels of an analog memory 200 at a frequency of the Rx2 reception clock signal, and are sequentially written by the controller to the analog memory cells of analog memory 200 at a timing of the Rx2 reception clock signal.

In the example of FIG. 2, the readout circuit 300 includes thirty-two (32) readout elements, each receiving outputs from four (4) output channels of the analog memory 200. The 128 output channels of the analog memory 200 are read at a frequency of the Tx1 transmission clock, while the readout elements of the readout circuit 300 are output at a frequency of the Tx2 transmission clock signal. In this example, each readout element includes a voltage buffer (OTA with capacitive feedback) and a voltage-to-current element Gm.

Still referring to FIG. 2, the outputs of each pair of readout elements of the readout circuit 300 is multiplexed by a switch contained in a second rank Rank2 of the analog multiplexer 400. In this example, the second rank Rank2 includes four (4) sets of switches SW0, SW1, SW2 and SW3, and is controlled at a frequency of the Tx3a transmission clock signal.

Finally, the outputs of each set of switches of the second rank Rank2 of the analog multiplexer 400 are multiplex by a switch of a first rank Rank1 of the analog multiplexer 400. In this example, the first rank Rank1 include a set of switches SW0, SW1, SW2 and SW3. Here, the first rank Rank1 is controlled at a frequency of the Tx3b transmission clock signal. The resultant output signal $A_{out}$ is applied to an output network 50 coupled to output voltage lines Vout+ and Vout−

Figure 3:
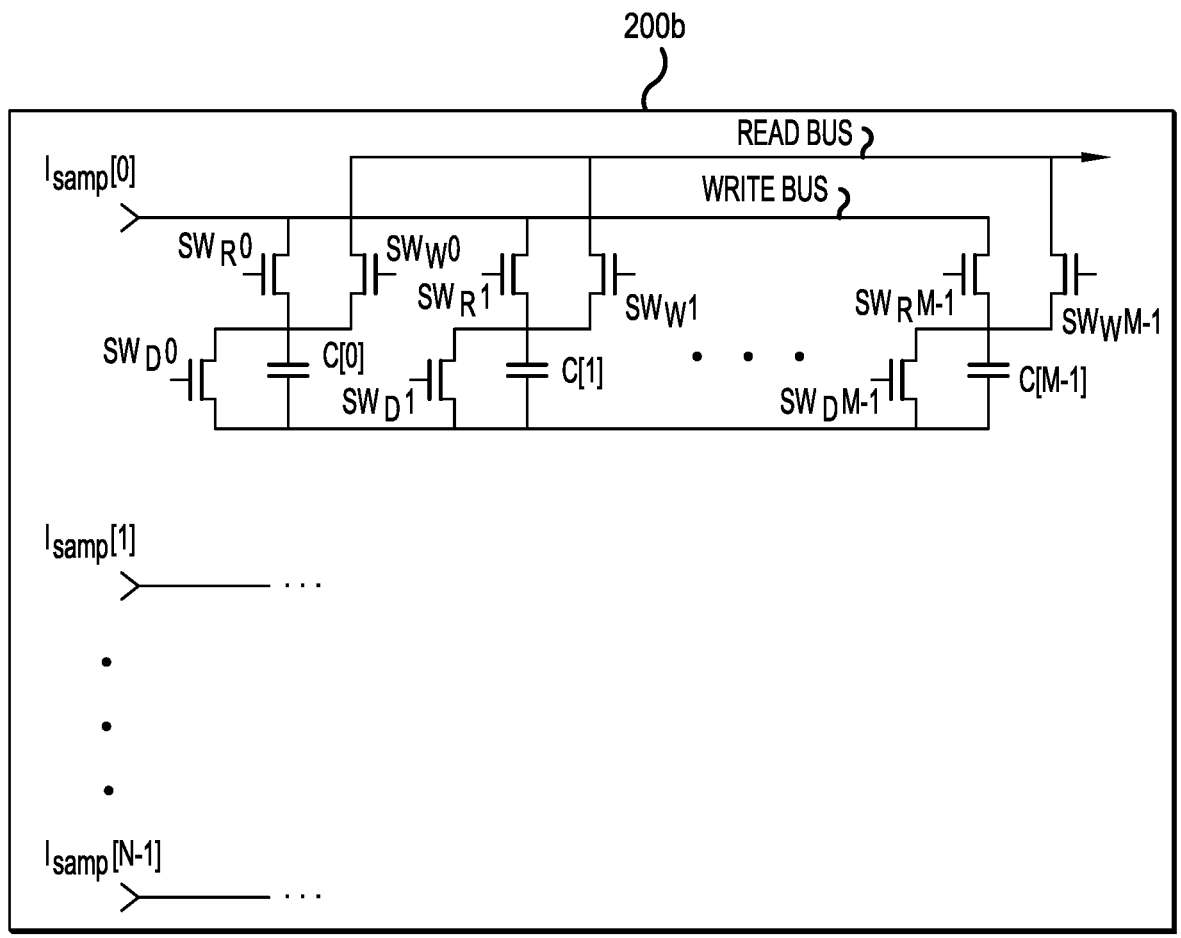
FIG. 3 is a circuit diagram illustrating an example of an analog memory cell bank according to an embodiment of the inventive concepts.

FIG. 3 illustrates an example of an analog memory cell bank of the analog memory 200 shown in FIGS. 1 and 2. The analog memory cell bank 200b of FIG. 3 may correspond to the analog memory cells 200b of FIG. 1.

As shown, the analog memory cell bank 200b includes N channels (or slices) supplying N input current samples Isamp[0] through Isamp[N−1] of the analog input signal $A_{in}$. As explained previously, these current samples are supplied from the sampling circuit 100 shown in FIGS. 1 and 2. Each input channel includes M memory elements C[0] through C[M−1]. As non-limiting examples, N may be 128, and M may be 8.

A write bus of each channel is coupled to the memory elements C[0] through C[M−1] through respective write switches $SW_W0$ through $SW_WM-1$. A read bus of each channel is coupled to the memory elements C[0] through C[M−1] through respective read switches $SW_R0$ through $SRW_RM-1$. The configuration may also include switches $SW_W0$ through $SW_WM-1$ for erasing or clearing the memory elements C[0] through C[M−1].

In an exemplary write operation, memory elements C[0] of the N channels are writing in a given write cycle. Then, in a next write cycle, memory element C[1] are written. This process continues until the memory elements C[M−1] are written, at which time the operation returns in the next write cycle to memory elements C[0].

Similarly, in an exemplary read operation, memory elements C[0] of the N channels are read in a given read cycle. Then, in a next read cycle, memory element C[1] are read. This process continues until the memory elements C[M−1] are read, at which time the operation returns in the next read cycle to memory elements C[0].

There is delay between the writing of any given memory element C to the read of the memory element C which corresponds to the offset in accumulated phase between transmission clock signals (read clock) relative to the reception clock signals (write clock).

Figure 4:
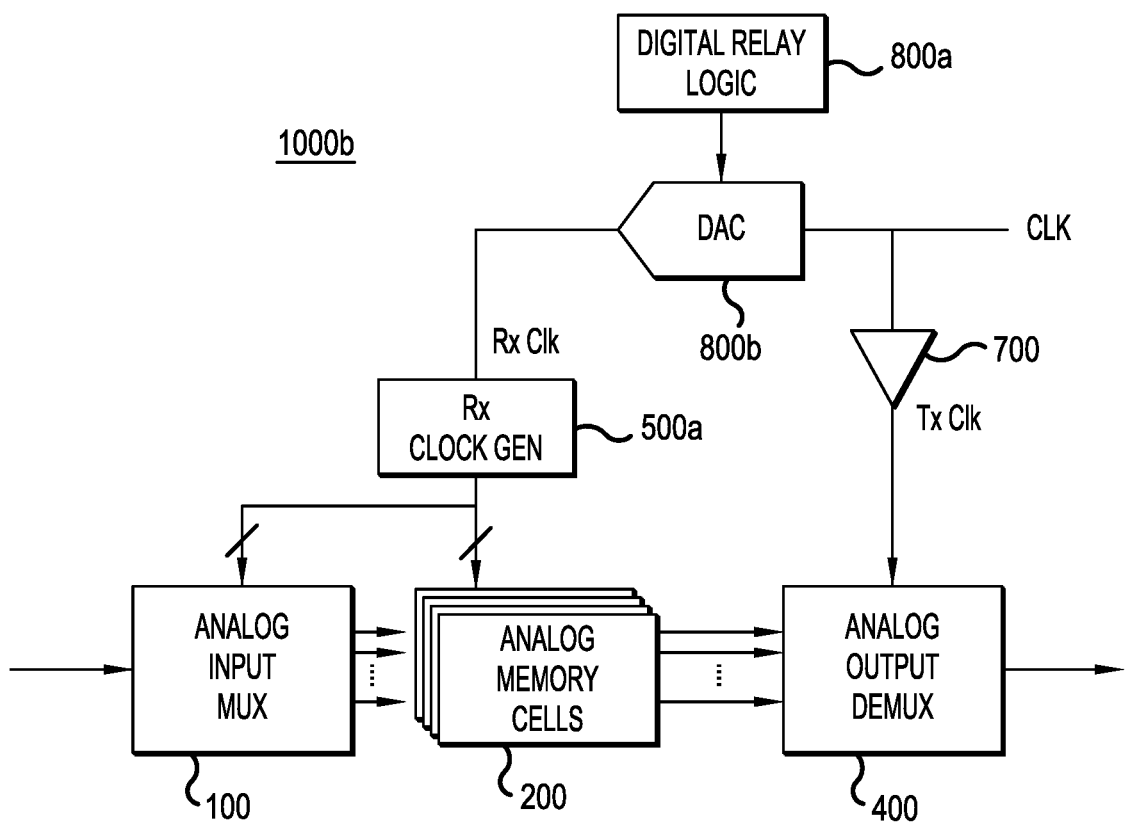
FIGS. 4 and 5 are circuit block diagrams for reference in describing alternative examples of generating reception and transmission clock signals for an analog delay line system according to embodiments of the inventive concepts.

In the example of FIG. 1, the offset in accumulated phase relative to the reception and transmission clock signals was introduced using a phase rotator. However, as previously mentioned, other techniques can be adopted to realize the phase offset. FIG. 4 is a block diagram of an analog delay line 1000b for reference in describing one such technique. Elements of the analog delay line 1000b that are the same as or similar to those of the previous embodiments are designated with the same reference numbers as in the previous embodiments, and a detailed description of such elements is omitted here to avoid redundancy.

Referring to FIG. 4, the analog delay line 1000b includes a sampling circuit 100, an analog memory 200, and an analog Mux 400 as in the previous embodiment. The readout circuit 300 and second clock generator 500b of the previous embodiments are omitted from the figure for simplicity. In this embodiment, the reception clock Rx applied to the first clock generator 500a is obtained using a high-fidelity low-noise high-speed digital-to-analog convertor (DAC) 800b. Here, clock references Rx and Tx may be phase locked with each other, to avoid timing drift and to reduce any impact from the reference CLK noise. Also, the delay of the clock signal RX may be generated and controlled in the digital domain of the DAC using digital delay logic 800a. This can result in a highly accurate timing process. That is, the accuracy and resolution of this timing process is related to the DAC's resolution and sampling speed, and it is not affected by the delay control elements as opposed to, for example, an analog or mixed-signal delay control implementation.

As other alternative, the phase shift can be generated from a phase interpolator or a PLL instead of a high-speed DAC. The tradeoff would be a lower system complexity, and hence lower power consumption at the expense of nonlinearity in the phase steps.

Figure 5:
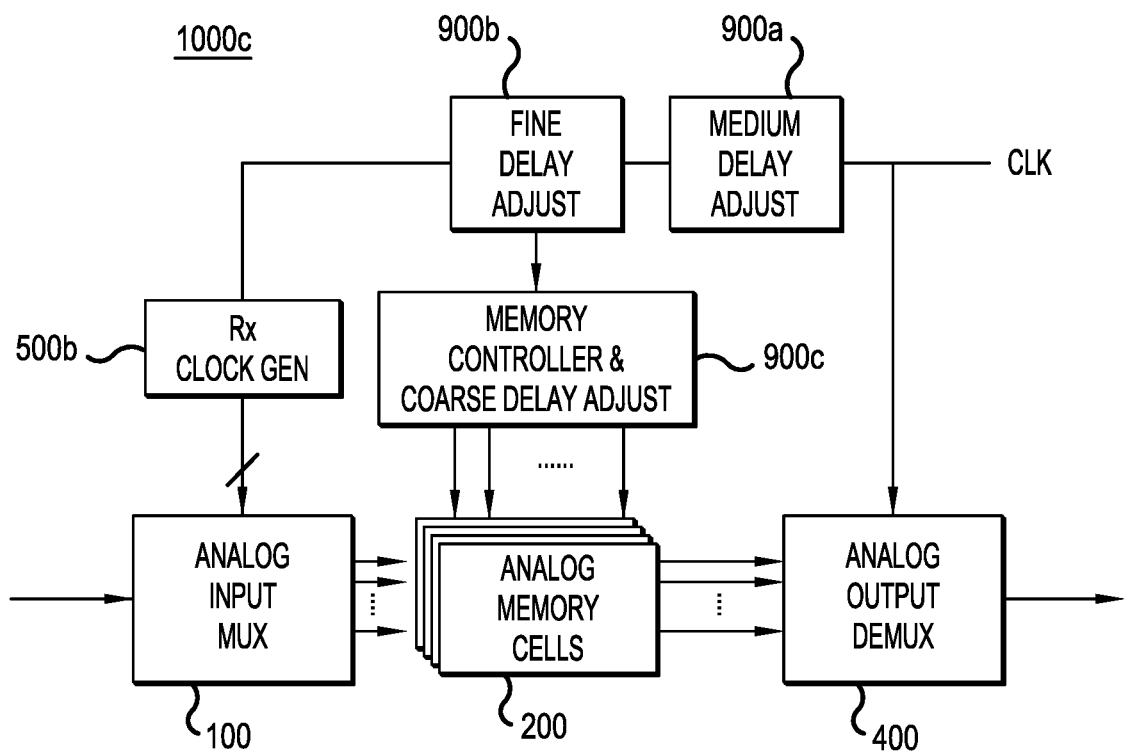

FIG. 5 is a circuit block diagram of an analog delay line for reference in describing another technique for generation of clock signals according to other embodiments of the inventive concepts. Again, elements of the delay line 1000c that are the same as or similar to those of the previous embodiments are designated with the same reference numbers as in the previous embodiments, and a detailed description of such elements is omitted here to avoid redundancy. The readout circuit 300 and second clock generator 500b of the previous embodiments are omitted from FIG. 5 for simplicity.

Referring to FIG. 5, the technique of this embodiment involves using one global clock for the entire transceiver system. The relative timing between the transmit and receive clock are managed by a series of delay control elements. By combining fine delay adjustment controls 900b, medium delay adjustment controls 900a and coarse delay adjustment controls 900c as shown, the system can operate over a wide delay range while fine tune the each one of the various delay steps. The coarse control 900c implemented with the memory controller can provide coverage over a wider tuning, then can be obtained fine-tune the delay step size by adjusting medium and fine control knobs.

As non-limiting examples, the fine control allows the analog clock to be adjusted with high resolution but only over a finite range. On the other hand, the medium control can be implemented as a crossbar across an analog readout wires, and it can cover a wider range with finite resolution. Finally, the memory readout pointer can be changed digitally under control of the memory controller to achieve the full delay range.

Figure 6:
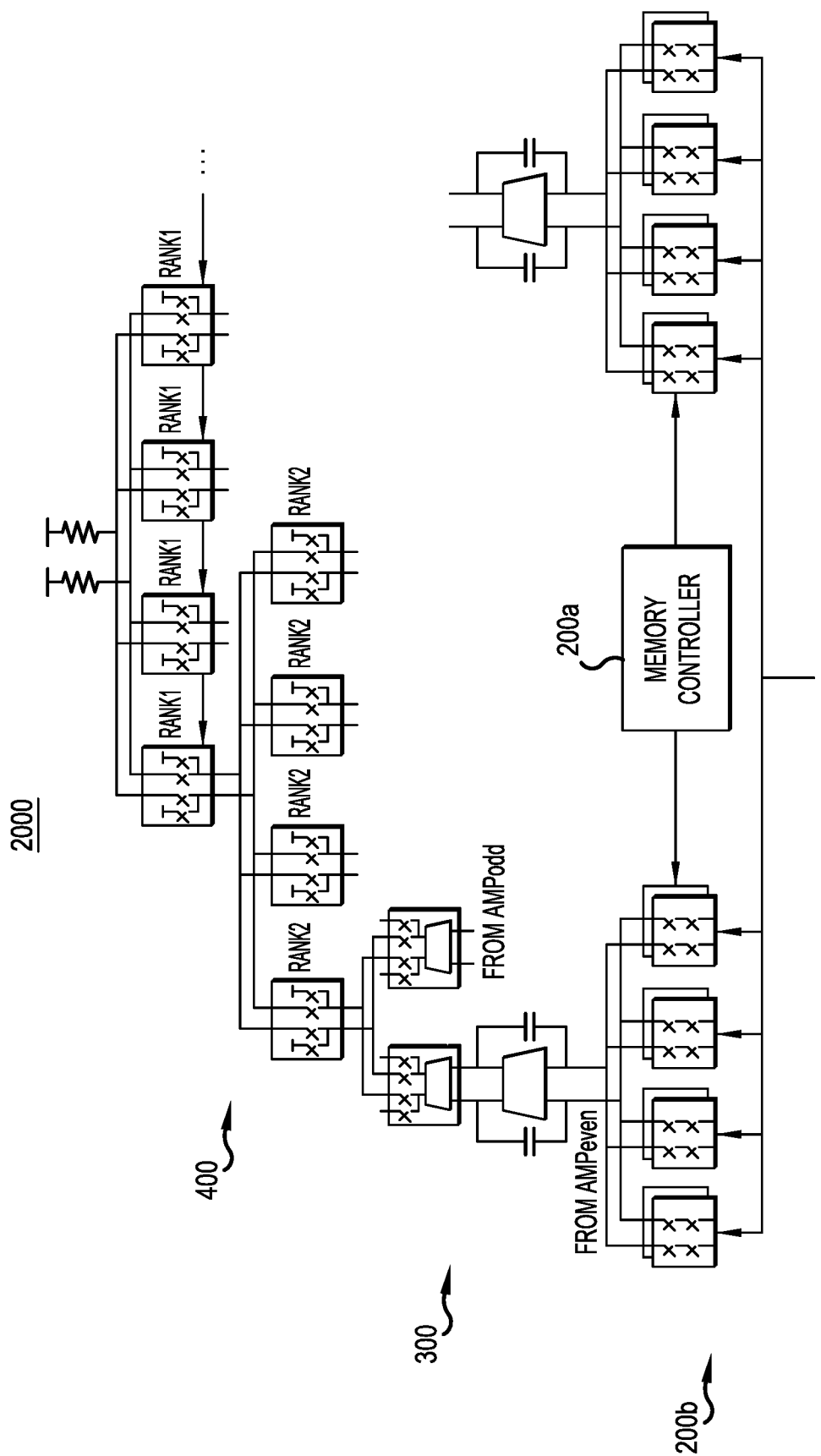
FIGS. 6 and 7 are a circuit diagram and a timing diagram for reference in describing an analog readout and multiplex operation according to an embodiment of the inventive concepts.

FIG. 6 is a circuit block diagram of an analog readout system according to embodiments of the inventive concepts. The system is essentially the same as the analog delay line 1000a of FIG. 2, but without the front-end sampling circuit 100 of the delay line 1000a. The system of FIG. 6 has utility, for example, as a high-speed analog readout circuit or Arbitrary Waveform Generator (AWG). Again, elements of the current embodiment that are the same as or similar to those of the previous embodiments are designated with the same reference numbers as in the previous embodiments, and a detailed description of such elements is omitted here to avoid redundancy.

Here, the memory cells 200b are assumed to be a capacitor array such as the memory bank described previously in connection with FIG. 3. The high-speed high-fidelity analog mux 400 has a multi-rank multiplexing structure as in the previous embodiments. The input stages or the lowest ranks operate at substantially lower speed and the speed increases through the hierarchy. Each rank of mux operates with a different timing window, namely, the input stage or the lowest rank operates with the largest timing windows, while the multiplexers of higher ranks operate with narrower timing windows, so they can run faster. The timing windows of different ranks are aligned in a way that the lower rank window properly encloses the rank above it, and so on and so forth. In such a way, the signal can be directed through the hierarchy of the mux to the system output, over the period of the narrowest window prescribed the highest mux switches.

Figure 7:
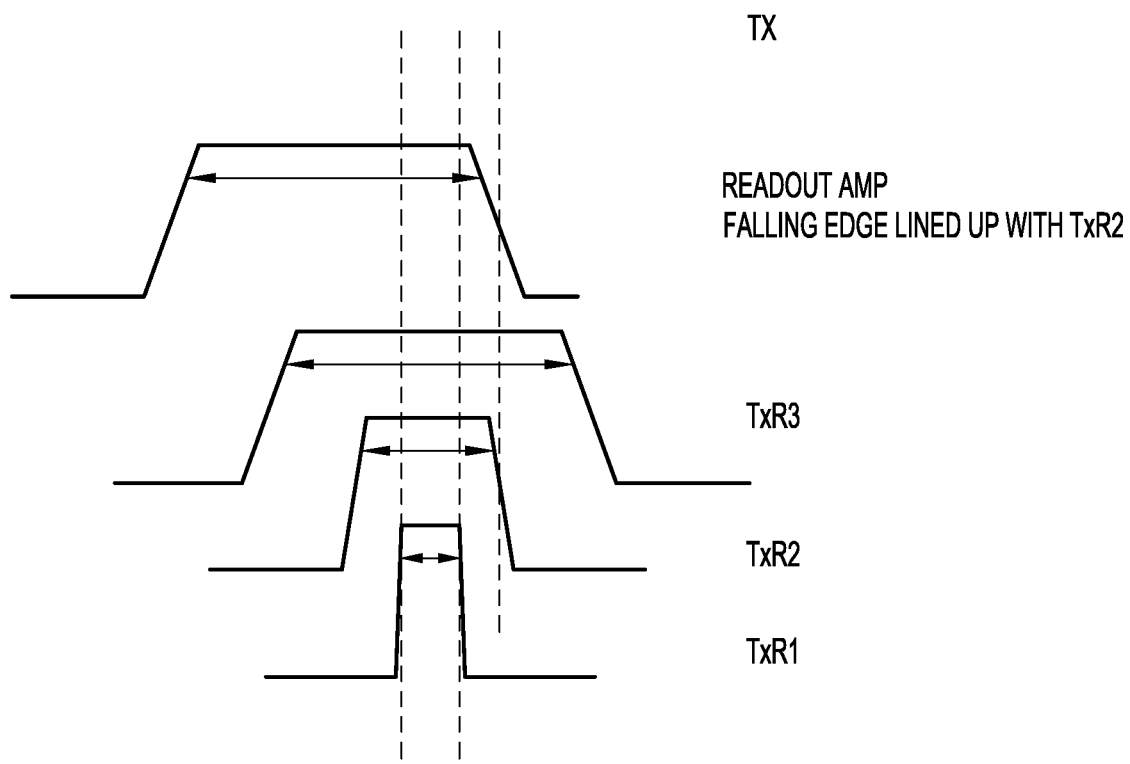

Attention is directed to FIG. 7 for reference in describing an example of the timing window calibration mentioned above. Timing window calibration may be essential for the operation of analog mux. Firstly, it can adjust the placement of the higher rank timing window so that the lower rank window can properly enclose it as shown in FIG. 7. Moreover, it also needs to fine tune the width of the timing window at each rank so that each rank can operate correctly at the desirable speed, without loss of signal due to transient settling and any kind of crosstalk between adjacent samples. Reset switches and dump paths may also be useful for such a high-speed multi-rank mux, since they are essential to remove memory at the intermediate nodes from the previous samples, and helps to preserve the signal integrity throughout the structure.

In one implementation, the readout circuit 2000 of FIG. 6 is an analog AWG. The classic implementation of AWG is a mixed signal solution, which contains highly sophisticated digital processing units, which not only consumes large amount of power, but also introduces substantial latency. In contrast, the AWG of FIG. 6 reduces the latency to bare minimum. By preserving the entire signal chain in the format of analog, the interface layers and digital fabrics which used to add substantial amount of the delay for signal propagations are avoided.

This AWG system consists of a series of analog memories (capacitor array), inter-stage buffers as well as a high-speed analog mux (multiplexer or serializer). Once the signal is stored into the analog memory bank, the memory controller selects the capacitor element in the appropriate order, and their voltage are sent to the input of the high-speed analog mux, and they are sent to the final output at the next mux clock cycle.

Various modifications to the embodiments described above fall within the scope of the inventive concepts. As one example, even though the entire signal chain is in analog format, it is still possible perform signal conditioning. One example would be if the memory bank is to be implemented with a group of unit capacitors. In this example, a FIR (Finite Impulse response) can be created by combining the stored value among different memory elements in inter-stage buffers. Here, the tap weight of the FIR can be adjusted by changing the number of cap units from each memory element. By connecting the cap to different input polarity, it allows us to sum and subtract the signal to one another.

Another way to create the FIR is to combine the signal at the analog Mux end. In other words, the analog Mux can be used as the analog summer instead of using the previously described inter-stage buffer. The tap weight might be even fine-tuned with the gain of the input pairs. The FIR can be used for a few purposes, such as to remove/counter the echo/memory residue in the analog frontend, as well as to place notches at a desirable frequency to null off image or interference tones, or both.

In addition, inter-path calibration techniques can be implemented. Mismatch from different paths of a poly-phase system degrades the final signal fidelity and it often sets a fundamental limit for the overall system performance. Past attempts involved digital calibration and correction, which results in large latency in the signal chain. According to embodiments of the inventive concepts, DC offset voltage of each path can be either removed through incorporating an auto-zero scheme at the switch capacitor buffer, or by including a trimming DAC at the analog mux's input stage.

Further, the gain variation of each path can be calibrated out at the input stage of analog mux by trimming the gain of the input pairs. This can be implemented with a coarse trimming and a fine trimming. The coarse trimming can be implemented by adjusting the number of input pairs switched in or out, while the fine trimming can be implemented by adjusting the size of the degeneration resistors.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

What is claimed is:

1. An analog delay line, comprising:
   a clock generator configured to output plural reception clock signals of different frequencies and plural transmission clock signals of different frequencies, the transmission clock signals offset in accumulated phase relative to the reception clock signals;
   an analog sampling circuit, controlled by at least one of the reception clock signals, configured to output a sequence of sampled voltages of an analog input signal;
   a bank of analog memory cells;
   a memory controller configured to control a write operation at a write frequency of at least one of the reception clock signals and a read operation at a read frequency of at least one of the transmission clock signals, the write operation sequentially storing the sampled voltages received from the analog sampling circuit in the bank of analog memory cells, and the read operation sequentially reading the sampled voltages from the bank of analog memory cells;
   an analog readout circuit configured to buffer the sampled voltages read from the bank of analog memory cells; and
   an analog multiplexer, controlled by at least one of the transmission clock signals, configured to multiplex the sampled voltages buffered by the readout circuit to generate an analog output signal;
   wherein a sampling rate of the analog input signal is within a factor of 2 of a sampling rate of the analog output signal.

2. The analog delay line of claim 1, wherein the analog output signal is delayed relative to the analog input signal by an amount corresponding to the offset in accumulated phase between the transmission and reception clock signals.

3. The analog delay line of claim 2, wherein the offset in accumulated phase between the transmission and reception clock signals is programmable.

4. The analog delay line of claim 1, wherein the bank of analog memory cells includes N inputs respectively receiving the sampled voltages from N outputs of the analog sampling circuit, and
   wherein the bank of analog memory cells includes N outputs respectfully outputting sampled voltages which are supplied to N inputs of the analog multiplexers via the analog readout circuit, where N is an integer.

5. The analog delay line of claim 4, wherein N is 32 or more.

6. The analog delay line of claim 4, wherein the N inputs of the bank of analog memory cells are connected to an N×M array of memory elements, where M is an integer of 2 or more defining a number of sets of N memory elements.

7. The analog delay line of claim 6, wherein a set of N memory elements of the N×M array of memory elements are written during each write cycle of the write operation, and a set of N memory elements of the N×M array of memory elements are read during each read cycle of the read operation.

8. The analog delay line of claim 7, wherein, for each of the M sets of N memory elements, the write cycle of the write operation is delayed relative to the read cycle of the read operation by an amount corresponding to the offset in accumulated phase between the transmission and reception clocks.

9. The analog delay line of claim 1, wherein the analog multiplexer is a multi-rank multiplexer.

10. The analog delay line of claim 9, wherein the analog sampling circuit includes a multi-rank demultiplexer.

11. The analog delay line of claim 1, wherein the analog readout circuit includes a plurality of buffer elements in on, and
    wherein each buffer element is configured to sequentially buffer the sampled voltages read from a plurality of memory cells of the bank of analog memory cells.

12. The analog delay line of claim 11, wherein the readout circuit further includes a plurality of voltage-to-current elements configured to convert a voltage output by each of the buffer elements into a corresponding current that is applied to the analog multiplexer.

13. The analog delay line of claim 12, wherein the analog multiplexer generates the analog output signal by applying a multiplexed current to an output network.

14. The analog delay line of claim 9, wherein the read and write frequencies are less than a frequency at which a lowest rank of the multi-rank multiplexer is controlled.

15. A readout system, comprising:
    a clock generator configured to output plural transmission clock signals of different frequencies;
    a bank of analog memory cells including N outputs, where N is a plural integer;
    a memory controller configured to control a read operation at a read frequency of at least one of the transmission clock signals, the read operation sequentially reading analog voltages from the N outputs of the bank of analog memory cells;
    an analog readout circuit including N analog buffers configured to buffer the analog voltages read from the N outputs of the bank of analog memory cells, respectively, and N voltage-to-current elements configured to convert a voltage output by a respective analog buffer into a corresponding analog current; and
    an analog multiplexer having N inputs, controlled by at least one of the transmission clock signals, configured to multiplex the analog currents from the readout circuit to generate an analog output signal.

16. The readout system of claim 15, wherein the analog multiplexer is a multi-rank multiplexer, and N is 32 or more.

17. The readout system of claim 16, wherein the N inputs of the bank of analog memory cells are connected to an N×M array of memory elements, where M is an integer of 2 or more defining a number of sets of N memory elements,
    wherein a set of N memory elements of the N×M array of memory elements are are read during each read cycle of the read operation.

18. The readout system of claim 15, wherein the analog multiplexer generates the analog output signal by applying a multiplexed current to an output network.

19. The readout system of claim 15, wherein the readout system is an arbitrary waveform generator (AWG).

20. A method of delaying an analog input signal, the method comprising:

generating plural reception clock signals of different frequencies and plural transmission clock signals of different frequencies, the transmission clock signals offset in accumulated phase relative to the reception clock signals;

sampling an analog input signal at a sampling frequency of at least one of the reception clock signals to generate a sequence of sampled voltages of an analog input signal;

writing the sampled voltages to a bank of analog memory cells at a write frequency of at least one of the reception clock signals;

reading the sampled voltages from the bank of analog memory cells at a read frequency of at least one of the transmission clock signals;

buffering the sampled voltages read from the bank of analog memory cells; and multiplexing the buffered sampled voltages under control of at least one of the transmission clock signals to generate an analog output signal;

wherein a sampling rate of the analog input signal is within a factor of 2 of a sampling rate of the analog output signal.

\* \* \* \* \*